US008482021B2

(12) United States Patent
Kim et al.

(10) Patent No.: US 8,482,021 B2
(45) Date of Patent: Jul. 9, 2013

(54) LIGHT EMITTING DEVICE, LIGHT EMITTING DEVICE PACKAGE AND LIGHTING SYSTEM

(75) Inventors: Sun Kyung Kim, Seoul (KR); Yong Tae Moon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 180 days.

(21) Appl. No.: 13/178,904

(22) Filed: Jul. 8, 2011

(65) Prior Publication Data

US 2012/0007041 A1 Jan. 12, 2012

(30) Foreign Application Priority Data

Jul. 9, 2010 (KR) .......................... 10-2010-0066393

(51) Int. Cl.
*H01L 33/00* (2010.01)
(52) U.S. Cl.
USPC ...................................... 257/98; 257/E33.008
(58) Field of Classification Search
USPC ................. 257/13–15, 17, 22, 79, 94, 97, 98, 257/103, E33.008
See application file for complete search history.

(56) References Cited

U.S. PATENT DOCUMENTS 8,174,040 B2 * 5/2012 Kim .............................. 257/98

FOREIGN PATENT DOCUMENTS

| JP | 09-214001 | | 8/1997 |
| JP | 2007-533143 | A | 11/2007 |
| KR | 10-0237804 | B1 | 1/2000 |
| KR | 10-0843426 | B1 | 7/2008 |
| KR | 10-2008-0093557 | A | 10/2008 |
| KR | 10-2009-0080218 | A | 7/2009 |

* cited by examiner

*Primary Examiner* — David Vu
(74) *Attorney, Agent, or Firm* — KED & Associates LLP

(57) ABSTRACT

A light emitting device, a light emitting device package, and a lighting system are provided. The light emitting device includes: a second conductive semiconductor layer; an active layer over the second conductive semiconductor layer; a first conductive semiconductor layer over the active layer; and a second electrode layer including a reflective layer under the second conductive semiconductor layer. The active layer includes a second active layer that actually emits light on the reflective layer and a first active layer that does not emit light on the second active layer. A distance between the reflective layer and the second active layer satisfies a constructive interference condition.

17 Claims, 7 Drawing Sheets

【FIG. 13】

LIGHT EMITTING DEVICE, LIGHT EMITTING DEVICE PACKAGE AND LIGHTING SYSTEM

CROSS-REFERENCE TO RELATED APPLICATIONS

This application claims under 35 U.S.C. §119 to Korean Patent Application No. 10-2010-0066393, Filed Jul. 9, 2010, which is hereby incorporated by reference.

BACKGROUND

The present disclosure relates to a light emitting device, a light emitting device package, and a lighting system.

The light emitting device is a semiconductor device for converting electric energy into light energy and may realize various colors by adjusting a composition ratio of a compound semiconductor.

The light emitting device emits light when electrons injected from an electron injection layer and electron-holes injected from an electron-hole injection layer are combined in an active layer.

Meanwhile, when the active layer of the light emitting device is close to a reflective mirror with high reflectivity, luminescence distribution may vary according to the distance between the active layer and the reflective mirror. For example, in a case of a vertical GaN Light Emitting Diode (LED), when a P—GaN and ohmic layer is disposed between Ag (corresponding to the reflective mirror) and Multi-Quantum Wells (MQWs) (corresponding to the active layer), the luminescence distribution of the MQWs of the active layer may be adjusted according to the thickness of the p-GaN and ohmic layer.

However, the reflective mirror may not be necessarily limited to metal. Actually, since luminescence distribution is adjusted with high reflectivity in a vertical direction, when a mirror of a dielectric layer such as Distributed Bragg Reflectors (DBRs) is disposed around the active layer, a similar phenomenon occurs.

Accordingly, if the distance between the active layer and the reflective mirror satisfies a constructive interference condition, the luminescence distribution of the MQWs is provided based on a vertical direction and this may improve extraction efficiency.

However, the extraction efficiency obtained by adjusting luminescence distribution through interference effect is effective when the thickness of the active layer is less than λ/n. If the thickness of the active layer is greater than λ/n, constructive and destructive conditions become uniformly distributed in the active layer so that extraction efficiency becomes identical to that of an average state (i.e., when there is no interference effect). However, if the active layer becomes thinner for interference effect, a reliability issue is raised due to the increase of leakage current.

SUMMARY

Embodiments provide a light emitting device with a structure maintaining existing interference effect without influencing its reliability by introducing a thicker active layer than an effective wavelength, a method of manufacturing the light emitting device, a light emitting device package, and a lighting system.

In one embodiment, a light emitting device includes: a second conductive semiconductor layer; an active layer over the second conductive semiconductor layer; a first conductive semiconductor layer over the active layer; and a second electrode layer including a reflective layer under the second conductive semiconductor layer, wherein the active layer includes a second active layer that actually emits light on the reflective layer and a first active layer that does not emit light on the second active layer; and a distance between the reflective layer and the second active layer satisfies a constructive interference condition.

In another embodiment, a light emitting device package includes: a package body; an electrode installed at the package body; and the light emitting device connected electrically to the electrode.

In further another embodiment, a lighting system includes: a substrate; and a light emitting module including the light emitting device package of claim 14 installed at the substrate.

The details of one or more embodiments are set forth in the accompanying drawings and the description below. Other features will be apparent from the description and drawings, and from the claims.

DETAILED DESCRIPTION OF THE EMBODIMENTS

Hereinafter, a light emitting device, a light emitting device package, and a lighting system according to an embodiment will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

(Embodiment)

An embodiment provides a light emitting device with a structure maintaining existing interference effect without influencing its reliability by introducing a thicker active layer than an effective wavelength, a method of manufacturing the light emitting device, a light emitting device package, and a lighting system.

Figure 1:
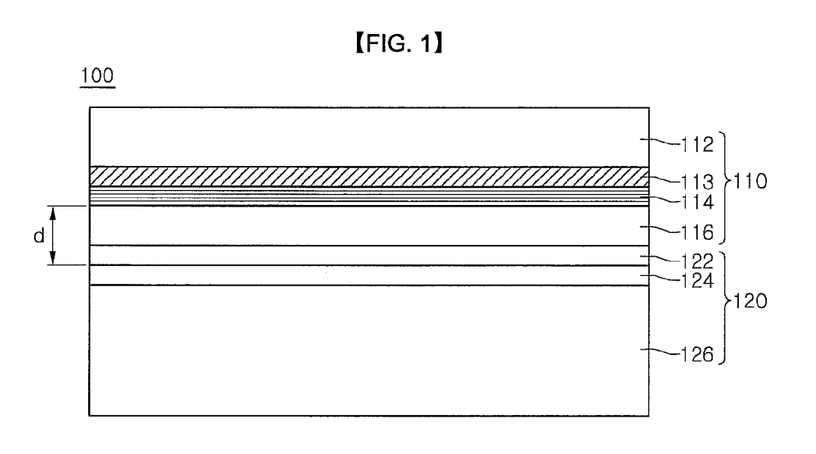
FIG. 1 is a cross sectional view of a light emitting device according to an embodiment.
Figure 2:
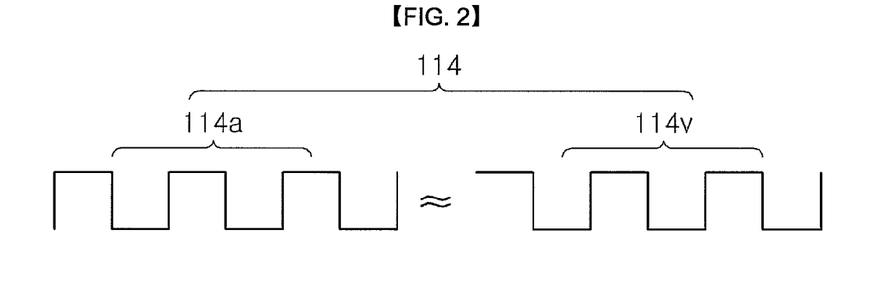
FIG. 2 is a view illustrating an active layer of a light emitting device according to an embodiment.

FIG. 1 is a cross sectional view of a light emitting device 100 according to an embodiment. FIG. 2 is a view illustrating an active layer of a light emitting device according to an embodiment.

To resolve the above object, the light emitting device 100 includes a second conductive semiconductor layer 116, an active layer 114 over the second conductive semiconductor layer 116, a first conductive semiconductor layer 112 over the active layer 114, and a second electrode layer 120 including a reflective layer 124 under the second conductive semiconductor layer 116. The active layer 114 includes a second active layer 114a that actually emits light on the reflective layer 124 and a first active layer 114v that does not emit light on the second active layer 114a. The distance between the reflective layer 124 and the second active layer 114a may satisfy a constructive interference condition.

According to an embodiment, when the second active layer 114a is disposed away from the reflective layer 124 to satisfy a constructive interference condition, luminous efficiency may be maximized and may be utilized. According to an embodiment, a reflective layer is disposed to satisfy a constructive interference in a vertical direction, so that an active layer may generate light in a vertical direction. For example, when light that is initially emitted upwardly and light that is emitted downwardly, reflected by a reflective layer, and then emitted upwardly among light generated from the active layer 114 satisfy a constructive interference condition of the same phase, light around a vertical direction becomes initially predominated.

The reflective layer 124 may be formed of one of metal, dielectric, or a combination thereof, but is not limited thereto.

Additionally, the reflective layer 124 may have a reflectivity of more than 30% in a vertical direction but is not limited thereto.

In an embodiment, if the distance between the reflective layer 124 and a quantum well closest to the reflective layer 124 in the second active layer 114a is d, d=($\lambda$/4n)×(2m+1) ±$\Delta$−2$\alpha$. Here, $\lambda$ is a wavelength of emitting light, n is an average refractive index of a medium between the active layer 114 and the reflective layer 124, m is an integer greater than or equal to 0, $\Delta$ is a value (for example, $\Delta$ may be $\lambda$/8n) smaller than 3$\lambda$/16n but is not limited thereto, and a may be a skin depth in the reflective layer 124.

For example, when the reflective layer 124 is formed of a dielectric, $\alpha$ is 0. When the reflective layer 124 is formed of metal, the skin depth of the metal satisfies $\alpha^{-1}$=4pk/l (k is an imaginary part in a refractive index of the metal). For example, in a case of a Ag mirror (k=2.65 @ 450 nm), $\alpha$ is about 13.5 nm.

Accordingly, even if the second active layer 114a is a multi quantum well, for example, when each quantum well is disposed at 3$\lambda$/4n, 5$\lambda$/4n, and 7$\lambda$/4n from the reflective layer 124, the maximum luminous efficiency can be obtained. At this point, the distance between each quantum well in the multi quantum well may be $\lambda$/2n±$\Delta$.

According to an embodiment, light generated through a hole-electron recombination process in each quantum well is deflected vertically. This means that a multi quantum well has the same tendency as a single quantum well. That is, without the sacrifice of initial internal quantum efficiency, a luminescence pattern deflected with a vertical angle can be adjusted.

According to an embodiment, a super lattice layer 113 interposed between the first conductive semiconductor layer 112 and the first active layer 114v may be further included but is not limited thereto. The super lattice layer 113 may be a layer that actually does not emit light.

An embodiment provides a light emitting device with a structure maintaining existing interference effect without influencing its reliability by introducing a thicker active layer than an effective wavelength, a method of manufacturing the light emitting device, a light emitting device package, and a lighting system.

For this, an entire thickness of the active layer 114 may be equal to or greater than $\lambda$/n and a thickness of the second active layer 114a may be equal to or less than $\lambda$/n, but the active layer 114 and the second active layer 114a are not limited thereto.

The first active layer 114v may be interposed between the reflective layer 124 and the second active layer 114a. Accordingly, the first active layer 114v may be more adjacent to the reflective layer 124 than the second active layer 114a.

Figure 3:
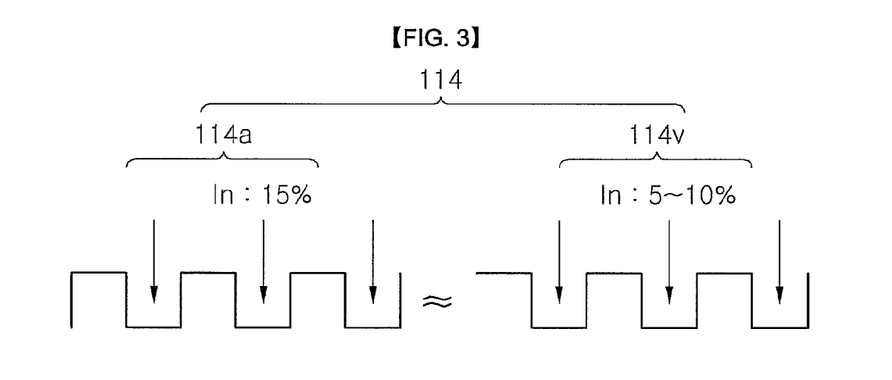
FIG. 3 is a first exemplary view of the active layer of the light emitting device according to an embodiment.
Figure 4:
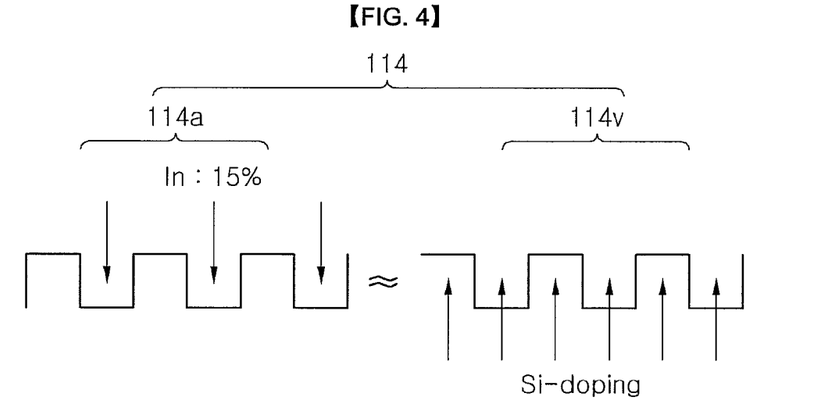
FIG. 4 is a second exemplary view of the active layer of the light emitting device according to an embodiment.

Or, the second active layer 114a may be interposed between the reflective layer 124 and the first active layer 114v. Accordingly, the second active layer 114a may be more adjacent to the reflective layer 124 than the first active layer 114v. FIG. 2 is an exemplary view illustrating the active layer 114 of the light emitting device according to an embodiment. FIG. 3 is a first exemplary view of the active layer 114 of the light emitting device according to an embodiment. FIG. 4 is a second exemplary view of the active layer 114 of the light emitting device according to an embodiment.

According to an embodiment, the active layer 114 may include a second active layer 114a that actually emits light and a first active layer 114v that does not emit light.

According to an embodiment, if an In composition is increased in a quantum well layer of the active layer 114, an energy bandgap of the quantum well layer becomes smaller and an energy absolute value of a quantum-mechanical energy level becomes also lowered.

On the contrary, if an In composition is decreased or Al or Si is included in a quantum well layer of the active layer 114, an energy bandgap of the quantum well layer becomes larger and an energy absolute value of a quantum-mechanical energy level becomes also higher. Therefore, the active layer 114 may not serve as an actual active layer.

For example, as shown in an embodiment of FIG. 3, an In composition of the first active layer 114v may be lower than that in the quantum well of the second active layer 114a.

For example, if the In composition of the second active layer 114a is about 15%, the In composition of the first active layer 114v is between 5% and 10%. The second active layer 114a actually emits light and the first active layer 114v does not emit light. That is, the second active layer 114a mainly emits light.

Additionally, as shown in FIG. 4, when Si is doped into a quantum well or a barrier of the first active layer 114v, the first active layer 114v does not actually emit light and the second active layer 114v mainly emits light. At this point, a doping concentration of Si in the first active layer 114v may be between $10^{16}$/cm$^3$ and $10^{19}$/cm$^3$ but is not limited thereto.

Also, if the active layer 114 is formed of Al$_x$Ga$_y$N (0≦x and y≦1), an Al composition in a quantum well of the first active layer 114v becomes greater than that of the second active layer 114a, so that the first active layer 114v does not actually emit light and the second active layer 114a mainly emits light.

According to an embodiment, an active layer includes actual emitters participating in an actual light emitting process and virtual emitters suppressing leakage current without participating in a light emitting process. Thus, an embodiment provides a light emitting device with a structure maintaining existing interference effect without influencing its reliability by introducing a thicker active layer than an effective wavelength, a method of manufacturing the light emitting device, a light emitting device package, and a lighting system.

Hereinafter, a method of manufacturing a light emitting device according to an embodiment will be described with reference to FIGS. 5 to 10.

Figure 5:
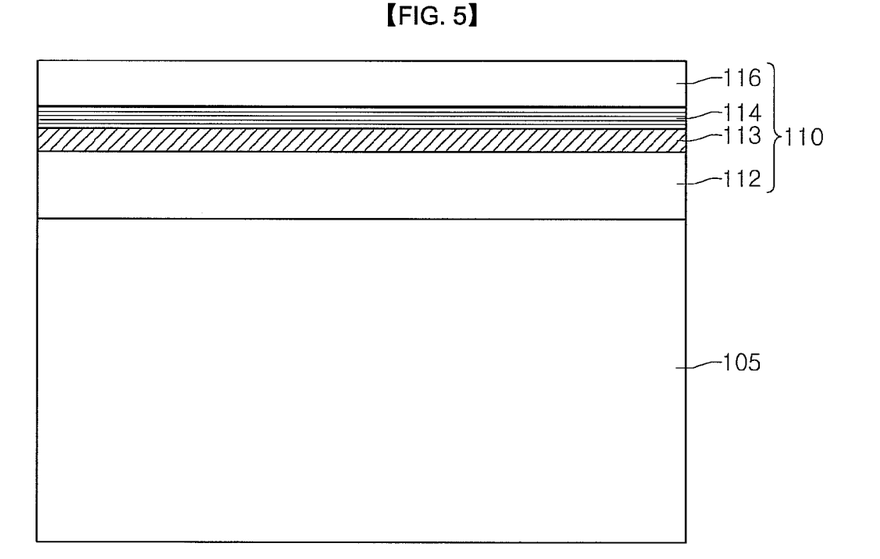
FIGS. 5 to 10 are sectional views illustrating a method of manufacturing a light emitting device according to an embodiment.

First, as shown in FIG. 5, a light emitting structure 110 is formed, where a first conductive semiconductor layer 112 is formed over a first substrate 105, an active layer 114 is formed over the first conductive semiconductor layer 112, and a second conductive semiconductor layer 116 is formed over the active layer 114.

The first substrate 105 includes a conductive substrate or an insulating substrate. For example, the first substrate 105 may be formed of at least one of $Al_2O_3$, SiC, Si GaAs, GaN, ZnO, GaP, InP, Ge, and $Ga_2O_3$. An uneven structure may be formed on the first substrate 105 but is not limited thereto. A wet cleaning may be performed on the first substrate 105 to remove impurities of the surface thereof.

After this, the light emitting structure 110 including the first conductive semiconductor layer 112, the active layer 114, and the second conductive semiconductor layer 116 may be formed on the first substrate 105.

A buffer layer (not shown) may be formed over the first substrate 105. The buffer layer may alleviate the lattice mismatch between the material of the light emitting structure 110 and the first substrate 105 and may be formed of a Group III to V compound semiconductor, that is, at least one of GaN, InN, AlN, InGaN, AlGaN, InAlGaN, and AlInN. An undoped semiconductor layer may be formed over the buffer layer but is not limited thereto.

The first conductive semiconductor layer 112 may be realized with a Group III to V compound semiconductor doped with a first conductive dopant. If the first conductive semiconductor layer 112 is an n-type semiconductor layer, the first conductive dopant may include Si, Ge, Sn, Se, or Te as an n-type dopant but is not limited thereto.

The first conductive semiconductor layer 112 may include a semiconductor material having an empirical formula of $In_xAl_yGa_{1-x-y}N$ ($0 \leq x \leq 1$, $0 \leq y \leq 1$, $0 \leq x+y \leq 1$).

The first conductive semiconductor layer 112 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive semiconductor layer 112 may be formed of an n-type GaN layer through Chemical Vapor Deposition (CVD), Molecular Bean Epitaxy (MBE), sputtering, or Hydride Vapor Phase Epitaxy (HVPE). Additionally, the first conductive semiconductor layer 112 may be formed when TMGa, $NH_3$, $N_2$, or $SiH_4$ including n-type impurity such as Si is injected into a chamber.

The active layer 114 is a layer where electrons injected through the first conductive semiconductor layer 112 and electron-holes injected through the second conductive semiconductor layer 116 formed later are combined so that light having an energy determined by an original energy band of a material in the active layer 114 is emitted.

The active layer 114 may be formed of at least one of a single quantum well structure, a multi quantum well structure, a quantum-wire structure, and a quantum dot structure. For example, the active layer 114 may be formed of a multi quantum well structure where TMGa gas, $NH_3$ gas, $N_2$ gas or TMIn gas is injected, but is not limited thereto.

A well layer/barrier layer of the active layer 114 may be formed of at least one pair structure of InGaN/GaN, InGaN/InGaN, AlGaN/GaN, InAlGaN/GaN, GaAs/AlGaAs(InGaAs), and GaP/AlGaP(InGaP), but is not limited thereto.

The well layer may be formed of a material having a lower bandgap than the barrier layer.

A conductive clad layer may be formed over or/and under the active layer 114. The conductive clad layer may be formed of an AlGaN based semiconductor and may have a higher bandgap than the active layer 114.

An embodiment provides a light emitting device with a structure maintaining existing interference effect without influencing its reliability by introducing a thicker active layer than an effective wavelength, a method of manufacturing the light emitting device, a light emitting device package, and a lighting system.

For this, an entire thickness of the active layer 114 may be equal to or greater than $\lambda/n$ and a thickness of the second active layer 114a may be less than $\lambda/n$, but the active layer 114 and the second active layer 114a are not limited thereto.

The second active layer 114a may be closer to the reflective layer 124 than the first active layer 114v.

Figure 6:
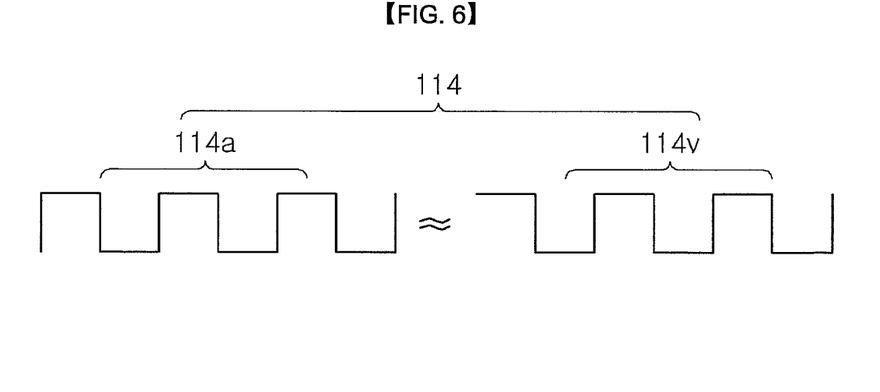
Figure 7:
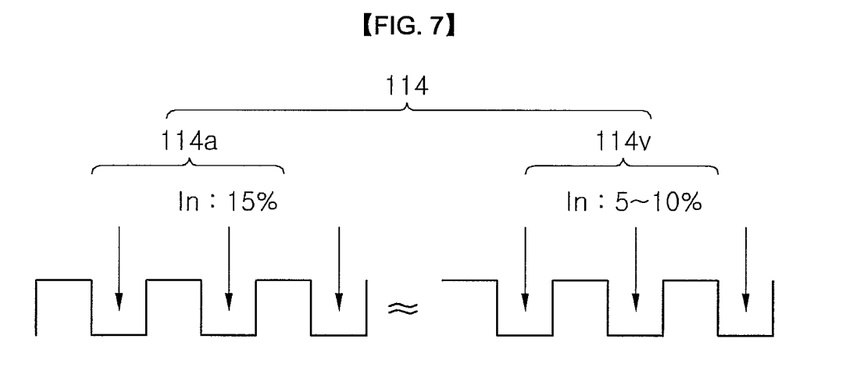
Figure 8:
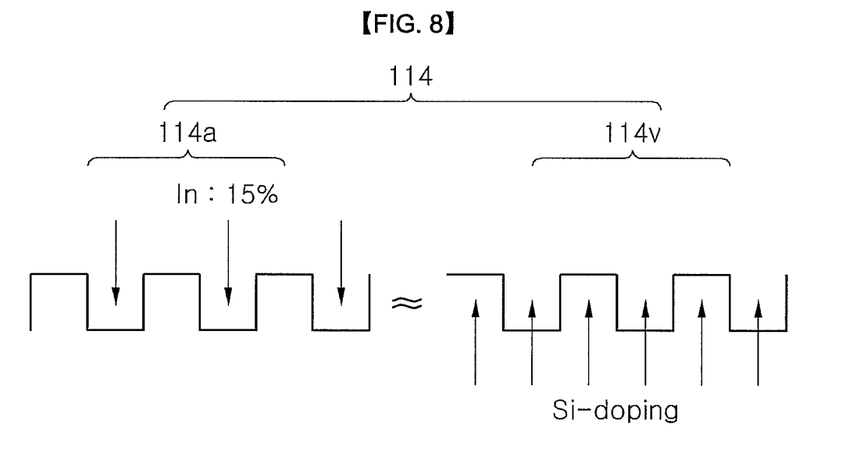

FIG. 6 is an exemplary view of the active layer 114 of the light emitting device according to an embodiment. FIG. 7 is a first exemplary view of the active layer 114 of the light emitting device according to an embodiment. FIG. 8 is a second exemplary view of the active layer 114 of the light emitting device according to an embodiment.

An embodiment provides a light emitting device with a structure maintaining existing interference effect without influencing its reliability by introducing a thicker active layer than an effective wavelength, a method of manufacturing the light emitting device, a light emitting device package, and a lighting system.

For this, an entire thickness of the active layer 114 may be equal to or greater than $\lambda/n$ and a thickness of the second active layer 114a may be less than $\lambda/n$, but the active layer 114 and the second active layer 114a are not limited thereto.

The second active layer 114a may be closer to the reflective layer 124a than the first active layer 114v.

According to an embodiment, the active layer 114 may include a second active layer 114a that actually emits light and a first active layer 114v that does not emit light.

According to an embodiment, if an In composition is increased in a quantum well layer of the active layer 114, an energy bandgap of the quantum well layer becomes smaller and an energy absolute value of a quantum-mechanical energy level becomes also lowered On the contrary, if an In composition is decreased or Al or Si is included in a quantum well layer of the active layer 114, an energy bandgap of the quantum well layer becomes larger and an energy absolute value of a quantum-mechanical energy level becomes also higher. Therefore, the active layer 114 may not serve as an actual active layer.

For example, as shown in an embodiment of FIG. 7, an In composition of the first active layer 114v may be lower than that in the quantum well of the second active layer 114a.

For example, if the In composition of the second active layer 114a is about 15%, the In composition of the first active layer 114v is between 5% and 10%. The second active layer 114a actually emits light and the first active layer 114v does not emit light. That is, the second active layer 114a mainly emits light.

Additionally, as shown in FIG. 8, when Si is doped into a quantum well or a barrier of the first active layer 114v, the first active layer 114v does not actually emit light and the second active layer 114v mainly emits light. At this point, a doping concentration of Si in the first active layer 114v may be between $10^{16}/cm^3$ and $10^{19}/cm^3$ but is not limited thereto.

Also, if the active layer 114 is formed of $Al_xGa_yN$ ($0 \leq x$ and $y \leq 1$), an Al composition in a quantum well of the first active layer 114v becomes greater than that of the second active layer 114a, so that the first active layer 114v does not actually emit light and the second active layer 114a mainly emits light.

According to an embodiment, an active layer includes actual emitters participating in an actual light emitting process and virtual emitters suppressing leakage current without participating in a light emitting process. Thus, an embodiment provides a light emitting device with a structure maintaining existing interference effect without influencing its reliability by introducing a thicker active layer than an effective wavelength, a method of manufacturing the light emitting device, a light emitting device package, and a lighting system.

According to an embodiment, a super lattice layer 113 interposed between the first conductive semiconductor layer 112 and the first active layer 114v may be further included but is not limited thereto. The super lattice layer 113 may be a layer that actually does not emit light.

The second conductive semiconductor layer 116 may include a Group III to V compound semiconductor doped with a second conductive dopant, for example a semiconductor material having an empirical formula of $In_xAl_yGa_{1-x-y}N$ ($0 \leq x \leq 1$, $0 \leq y \leq 1$, $0 \leq x+y \leq 1$). If the second conductive semiconductor layer 116 is a p-type semiconductor layer, the second conductive dopant may include Mg, Zn, Ca, Sr, or Ba as a p-type dopant.

The second conductive semiconductor layer 116 may be formed of a p-type GAN layer when TMga gas, $NH_3$ gas, $N_2$ gas, or ($EtCp_2Mg$) {$Mg(C_2H_5C_5H_4)_2$} gas including p-type impurity such as Mg is injected into a chamber, but is not limited thereto.

In an embodiment, the first conductive semiconductor layer 112 may be realized with an n-type semiconductor layer and the second conductive semiconductor layer 116 may be realized with a p-type semiconductor layer, but they are not limited thereto. Also, a semiconductor having an opposite polarity to the second conductive type layer, for example, an n-type semiconductor layer (not shown), may be formed over the second conductive semiconductor layer 116. Accordingly, the light emitting structure 110 may be realized with one of an N—P junction structure, a P—N junction structure, an N—P—N junction structure, and a P—N—P junction structure.

Figure 9:
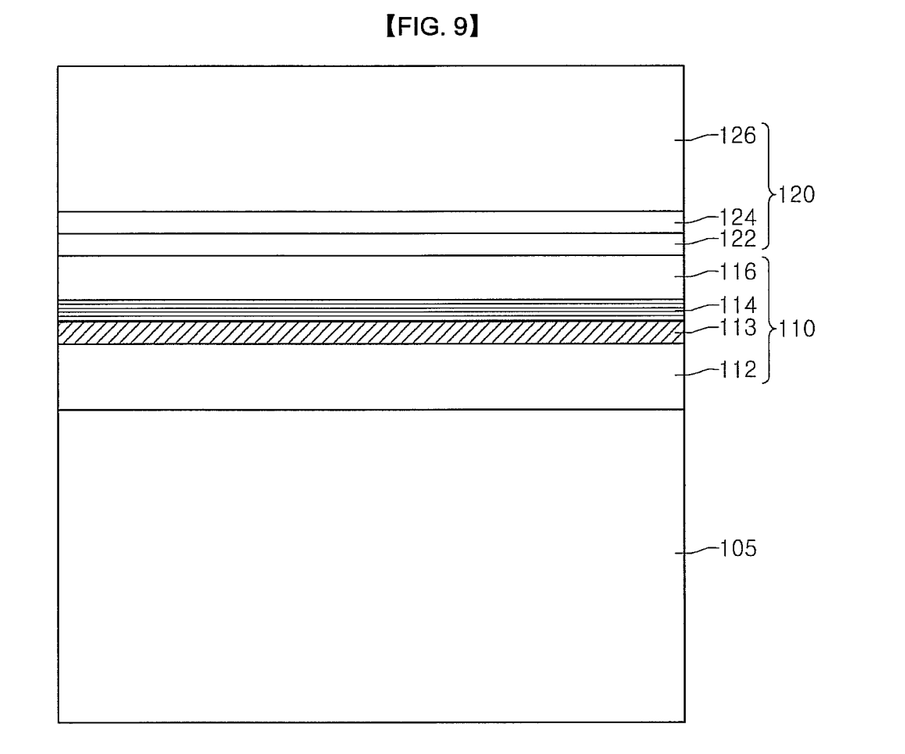

After this, a second electrode layer 120 is formed over the second conductive semiconductor layer 116.

The second electrode layer 120 may include an ohmic layer 122, a reflective layer 124, a coupling layer (not shown), and a conductive substrate (not shown). The second electrode layer 120 may be formed of at last one of Ti, Cr, Ni, Al, Pt, Au, W, Mo, and a semiconductor substrate having an impurity injected.

For example, the second electrode layer 120 may include the ohmic layer 122 and may be formed by stacking a single metal a metal alloy, or a metal oxide several times. For example, the ohmic layer 122 may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but is not limited to thereto.

Additionally, if the second electrode layer 120 includes the reflective layer 124, it may be formed of a metal layer including Al, Ag, Cu, or an alloy including at least one thereof. Al or Ag effectively reflects light generated in an active layer, thereby greatly improving the light extraction efficiency of the light emitting device.

According to an embodiment, when the second active layer 114a is disposed away from the reflective layer 124 to satisfy a constructive interference condition, luminous efficiency may be maximized and may be utilized. According to an embodiment, a reflective layer is disposed to satisfy a constructive interference in a vertical direction, so that an active layer may generate light in a vertical direction. For example, when light that is initially emitted upwardly and light that is emitted downwardly, reflected by a reflective layer, and then emitted upwardly among light generated from the active layer 114 satisfy a constructive interference condition of the same phase, light around a vertical direction becomes initially predominated.

The reflective layer 124 may be formed of one of metal, dielectric, and a combination thereof, but is not limited thereto. Even when the reflective layer 124 is formed of a dielectric, the second conductive semiconductor layer 116 may be designed to be electrically connected to the second electrode layer 120.

Additionally, the reflective layer 124 may have a reflectivity of more than 30% in a vertical direction but is not limited thereto.

In an embodiment, if the distance between the reflective layer 124 and a quantum well closest to the reflective layer 124 in the second active layer 114a is d, $d=(\lambda/4n)\times(2m+1) \pm \Delta - 2\alpha$. Here, $\lambda$ is a wavelength of emitting light, n is an average refractive index of a medium between the active layer 114 and the reflective layer 124, m is an integer greater than or equal to 0, $\Delta$ is a value (for example, $\Delta$ may be $\lambda/8n$) smaller than $3\lambda/16n$ but is not limited thereto, and a may be a skin depth in the reflective layer 124.

For example, when the reflective layer 124 is formed of a dielectric, $\alpha$ is 0. When the reflective layer 124 is formed of metal, the skin depth of the metal satisfies $\alpha-1=4pk/l$ (k is an imaginary part in a refractive index of the metal). For example, in a case of a Ag mirror (k=2.65 @ 450 nm), $\alpha$ is about 13.5 nm.

Accordingly, even if the second active layer 114a is a multi quantum well, for example, when each quantum well is disposed at $3\lambda/4n$, $5\lambda/4n$, and $7\lambda/4n$ from the reflective layer 124, the maximum luminous efficiency can be obtained. At this point, the distance between each quantum well in a multi quantum well may be $\lambda/2n\pm\Delta$.

According to an embodiment, light generated through a hole-electron recombination process in each quantum well is deflected vertically. This means that a multi quantum well has the same tendency as a single quantum well. That is, without the sacrifice of initial internal quantum efficiency, a luminescence pattern deflected with a vertical angle can be adjusted.

Additionally, when the second electrode layer 120 includes a coupling layer, the reflective layer 124 may serve as the coupling layer or may be formed of Ni or Au.

Additionally, the second electrode layer 120 may include a conductive substrate 126. If the first conductive semiconductor layer 122 has a sufficient thickness of more than 50 μm, a process for forming the conductive substrate 126 may be omitted. The conductive substrate 126 may be formed of a metal, a metal alloy, or a conductive semiconductor material with excellent electrical conductivity in order to effectively inject electron-holes. For example, the conductive substrate 126 may selectively include Cu, Au, Cu Alloy, Ni, Cu—W, and a carrier wafer (for example, formed of GaN, Si, Ge, GaAs, ZnO, SiGe, or SiC).

A method of forming the conductive substrate 126 may include an electrochemical metal deposition method or a bonding method using eutectic metal.

Figure 10:
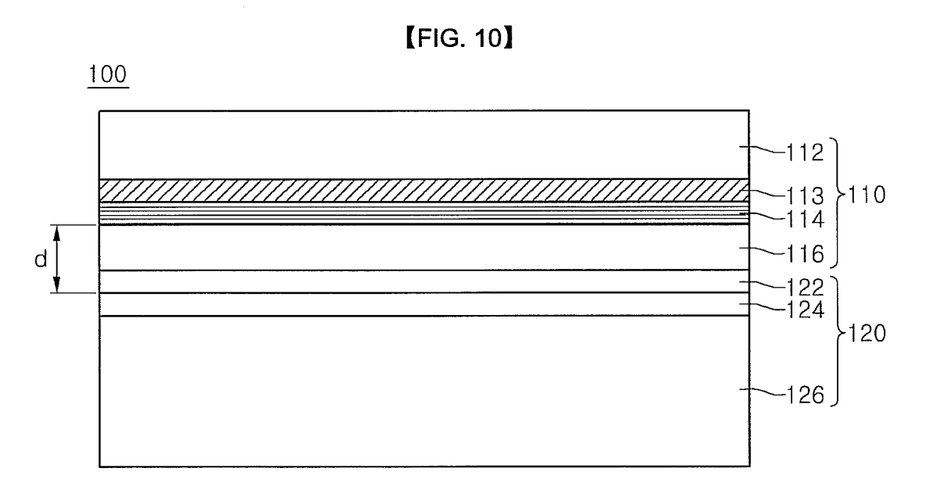

As shown in FIG. 10, the first substrate 105 is removed to expose the first conductive semiconductor layer 112. The removing of the first substrate 105 may be performed by using high-power laser to separate the first substrate 105 or using a chemical etching method. Additionally, the first substrate 105 may be physically grounded to be removed.

For example, according to a laser lift off method, when a predetermined energy is applied at a room temperature, energy is absorbed at an interface between the first substrate 105 and the light emitting structure, so that the junction surface of the light emitting structure is thermally decomposed to separate the first substrate 105 from the light emitting structure.

According to an embodiment, an active layer includes actual emitters participating in an actual light emitting process and virtual emitters suppressing leakage current without participating in a light emitting process. Thus, an embodiment provides a light emitting device with a structure maintaining existing interference effect without influencing its reliability by introducing a thicker active layer than an effective wavelength, a method of manufacturing the light emitting device, a light emitting device package, and a lighting system.

Figure 11:
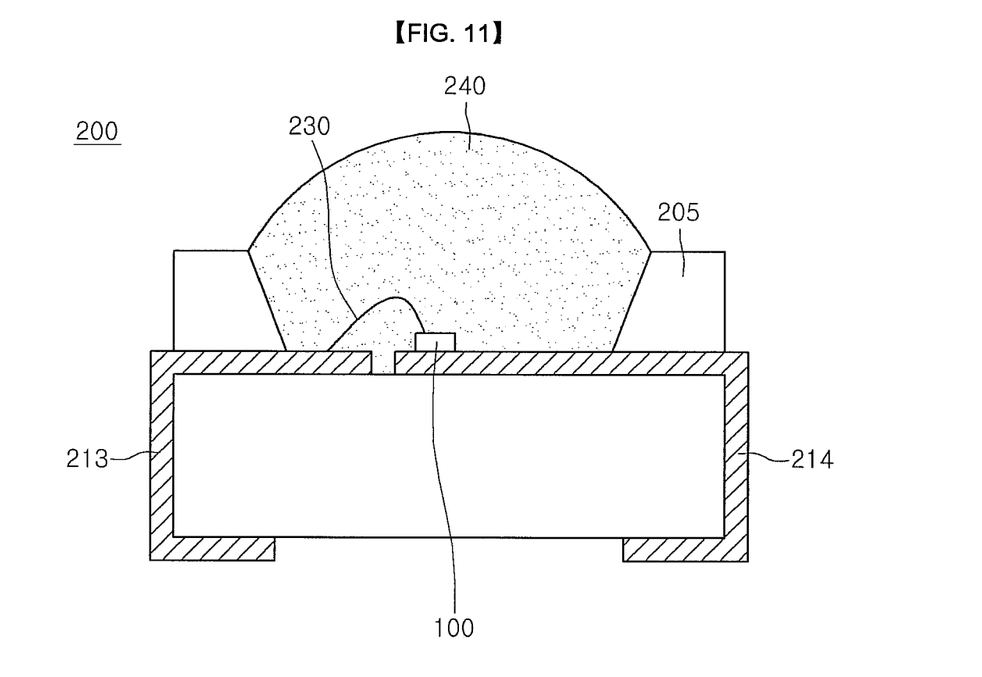
FIG. 11 is a view of a light emitting device package having a light emitting device according to an embodiment.

FIG. 11 is a view of a light emitting device package 200 having a light emitting device according to an embodiment.

Referring to FIG. 11, the light emitting device package includes a body 200, a third electrode layer 213 and a fourth electrode layer 214 installed at the body 200, a light emitting device 100 electrically connected to the third and fourth electrode layers 213 and 213 installed at the body 200, and a molding member 240 surrounding the light emitting device 100.

The body 200 may be formed of silicon material, synthetic resin material, or metal material and may be disposed at an inclined plane around the light emitting device 100.

The third electrode layer 213 and the fourth electrode layer 214 are electrically separated from each other and serve to provide power to the light emitting device 100. Additionally, the third and fourth electrode layers 213 and 213 may serve to reflect light generated from the light emitting device 100 to increase light efficiency and may serve to discharge heat generated from the light emitting device 100 to the external.

The vertical type shown in FIG. 1 may be applied to the light emitting device 100 and the light emitting device 100 may be installed on the body 200 or may be installed on the third electrode layer 213 or the fourth electrode layer 213.

The light emitting device 100 may be electrically connected to the third electrode layer 213 and/or the fourth electrode layer 214 through a wire 230. According to an embodiment, since the vertical light emitting device 100 is exemplarily shown, only one wire 230 is used. As another example, if the light emitting device 100 has a horizontal type, two wires 230 may be used and, if the light emitting device 100 has a flip chip type, no wire 230 may be used.

The molding member 240 surrounds the light emitting device 100 to protect it. Additionally, the molding member 240 includes a fluorescent substance to change a wavelength of the light emitted from the light emitting device 100.

A light emitting device package according to an embodiment may be applied to a lighting system. The lighting system includes a lighting unit shown in FIG. 12 and a backlight unit shown in FIG. 13, and may be applied to a traffic light, a vehicle headlight, and a signboard.

Figure 12:
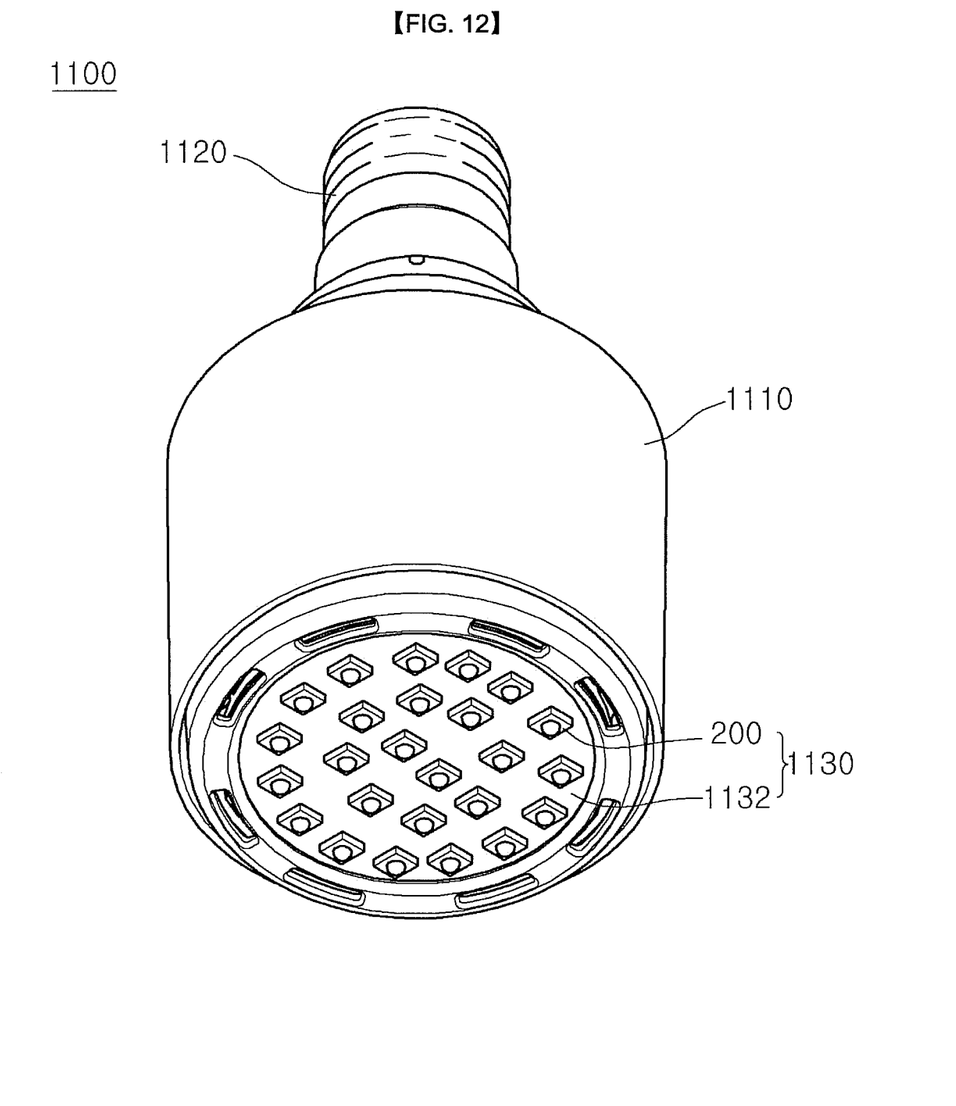
FIG. 12 is a perspective view of a lighting unit according to an embodiment.

FIG. 12 is a perspective view of a lighting unit according to an embodiment.

Referring to FIG. 12, the lighting unit 1100 includes a case body 110, a light emitting module 1130 installed at the case body 1110, and a connection terminal 1120 installed at the case body 1110 and configured to receive power from the external.

The case body 1110 may be formed of a material having excellent heat emission characteristic, for example, a metal material or a resin material.

The light emitting module 1130 may include a substrate 1132 and at least one light emitting package 200 mounted on the substrate 1132.

A circuit pattern may be printed on an insulator to form the substrate 1132. For example, the substrate 1132 may include a typical Printed Circuit Board (PCB), a metal core PCB, a flexible PCB, and a ceramic PCB.

Additionally, the substrate 1132 may be formed of a material for efficiently reflecting light or may have a color such as white or silver for efficiently reflecting light from the surface.

The at least one light emitting device package 200 may be mounted over the substrate 1132. Each light emitting device package 200 may include at least one light emitting device 100. The light emitting device 100 may include a colored light emitting diode emitting each colored light of red, green, and blue or an Ultra Violet (UV) light emitting diode emitting UV.

The light emitting module 1130 may be disposed with various combinations of the light emitting device packages 200 to obtain colors and luminance. For example, a white light emitting diode, a red light emitting diode, and a green light emitting diode may be combined and disposed to obtain a high Color Rendering Index (CRI).

The connection terminal 1120 may be electrically connected to the light emitting module 1130 to supply power. The connection terminal 1120 may have a socket type and thus may be rotated and inserted into the external power, but is not limited thereto. For example, the connection terminal 1120 may have a pin type and thus may be inserted into the external power or may be connected to the external power through a wire.

Figure 13:
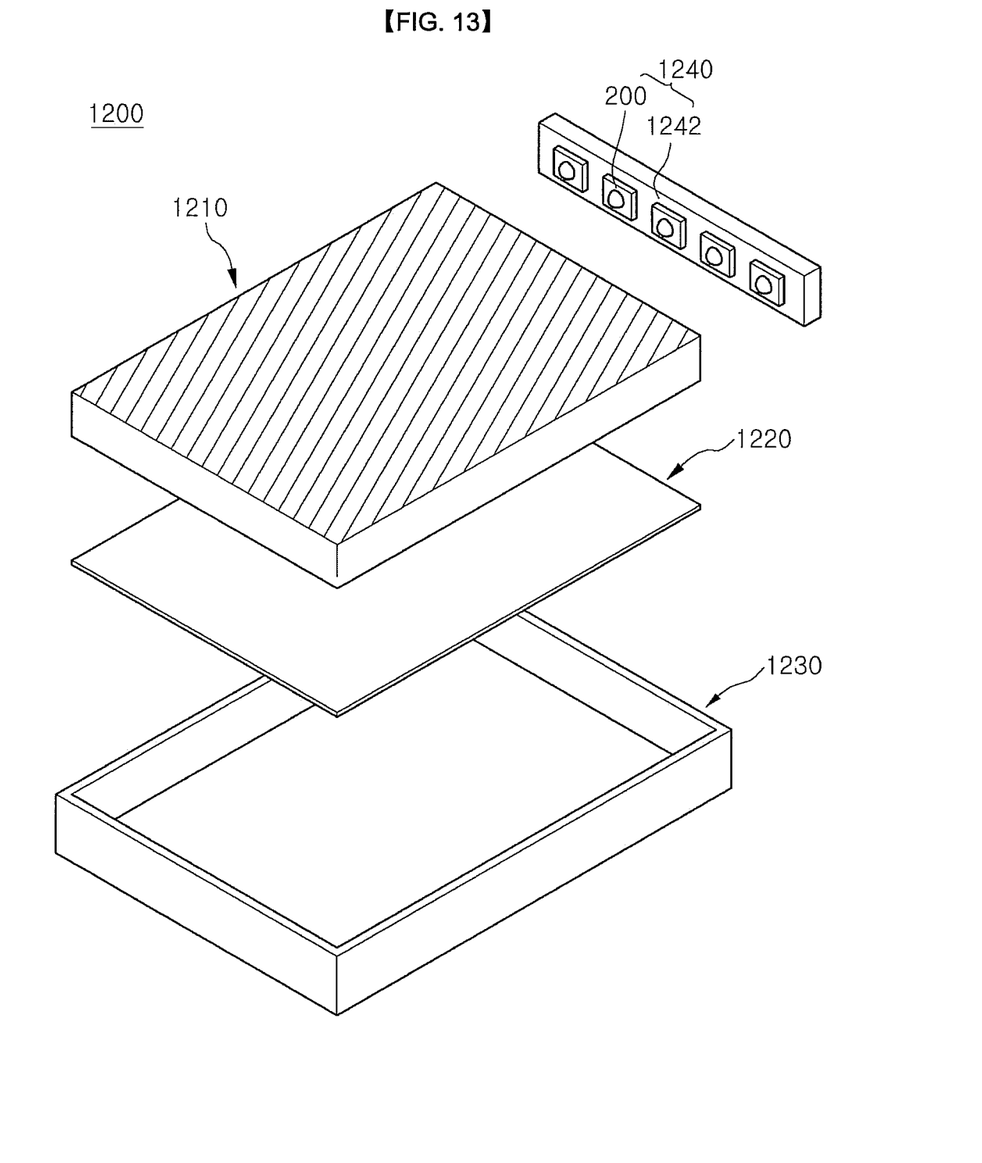
FIG. 13 is an explosive perspective view of a backlight unit according to an embodiment.

FIG. 13 is an explosive perspective view of a backlight unit 1200 according to an embodiment.

The backlight unit 1200 may include a light guide plate 1210, a light emitting module 1240 providing light to the light guide plate 1210, a reflective member 1220 under the light guide plate 1210, and a bottom cover 1230 receiving the light guide plate 1210, the light emitting module 1240, and the reflective member 1220, but is not limited thereto.

The light guide plate 1210 diffuses light to provide a surface light source. The light guide plate 1210 may be formed of a transparent material, for example, one of an acrylic resin series such as polymethyl metaacrylate (PMMA), a polyethylene terephthlate (PET) resin, a poly carbonate (PC) resin, a cycloolefin copolymer (COC) resin, and a polyethylene naphthalate (PEN) resin.

The light emitting module 1240 provides light to at least one side of the light guide plate 1210 and ultimately serves as a light source of a display device having the backlight unit 1200 installed.

The light emitting module 1240 may contact the light guide plate 1210 but is not limited thereto. In more detail, the light emitting module 1240 includes a substrate 1242 and a plurality of light emitting device packages 200 mounted on the substrate 1242. The substrate 1242 may contact the light guide plate 1210 but is not limited thereto.

The substrate 1242 may be a Printed Circuit Board (PCB) having a circuit pattern (not shown). However, the substrate 1242 may include a typical PCB, a metal core PCB (MCPCB), and a flexible PCB (FPCB), but is not limited thereto.

Moreover, the plurality of light emitting device packages 200 may be mounted on the substrate 1242 to allow the light emitting surface to be spaced from the light guide plate 1210 by a predetermined distance.

The reflective member 1220 may be formed under the light guide plate 1210. The reflective member 1220 reflects an incident light upwardly toward the bottom surface of the light guide plate 1210 to improve the brightness of the backlight unit 1200. The reflective member 1220 may be formed of a PET, PC, or PVC resin, but is not limited thereto.

The bottom cover 1230 may receive the light guide plate 1210, the light emitting module 1240, and the reflective member 1220. For this, the bottom cover 1230 may have a box having the top opened, but is not limited thereto.

The bottom cover 1230 may be formed of a metal material or a resin material through a press molding or extrusion molding process.

According to an embodiment, an active layer includes actual emitters participating in an actual light emitting process and virtual emitters suppressing leakage current without participating in a light emitting process. Thus, an embodiment provides a light emitting device with a structure maintaining existing interference effect without influencing its reliability by introducing a thicker active layer than an effective wavelength, a method of manufacturing the light emitting device, a light emitting device package, and a lighting system.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a second conductive semiconductor layer;
an active layer over the second conductive semiconductor layer;
a first conductive semiconductor layer over the active layer; and
a second electrode layer including a reflective layer under the second conductive semiconductor layer,
wherein the active layer comprises a second active layer that actually emits light on the reflective layer and a first active layer that does not emit light on the second active layer; and
a distance between the reflective layer and the second active layer satisfies a constructive interference condition.

2. The light emitting device according to claim 1, wherein the first active layer is interposed between the reflective layer and the second active layer.

3. The light emitting device according to claim 1, wherein the second active layer is interposed between the reflective layer and the first active layer.

4. The light emitting device according to claim 1, further comprising a super lattice layer interposed between the first conductive semiconductor layer and the first active layer.

5. The light emitting device according to claim 1, wherein an In composition of the first active layer is less than that in a quantum well of the second active layer.

6. The light emitting device according to claim 5, wherein the In composition of the first active layer is between about 5% and about 10%.

7. The light emitting device according to claim 1, wherein when the active layer is formed of $Al_xGa_yN$ ($0 \leq x$ and $y \leq 1$), an Al composition in a quantum well of the first active layer is greater than that of the second active layer.

8. The light emitting device according to claim 1, wherein Si is doped into a quantum well or a barrier of the first active layer.

9. The light emitting device according to claim 1, wherein a doping concentration of Si in the first active layer is between about $10^{16}/cm^3$ and about $10^{19}/cm^3$.

10. The light emitting device according to claim 1, wherein an entire thickness of the active layer is equal to or greater than $\lambda/n$.

11. The light emitting device according to claim 1, wherein a thickness of the second active layer is equal to or less than $\lambda/n$.

12. The light emitting device according to claim 1, wherein the second active layer is closer to the reflective layer than the first active layer.

13. The light emitting device according to claim 1, wherein the reflective layer is formed of a metal, a dielectric, or a combination thereof.

14. The light emitting device according to claim 1, wherein the reflective layer has a reflectivity of more than about 30% in a vertical direction.

15. A lighting system comprising:
a substrate; and
a light emitting module including the light emitting device package of claim 14 installed at the substrate.

16. The light emitting device according to claim 1, wherein if the distance between the reflective layer and a quantum well closest to the reflective layer in the second active layer is d, $d=(\lambda/4n) \times (2m \pm 1) \pm \Delta - 2\alpha$,
wherein $\lambda$ is a wavelength of emitting light, n is an average refractive index of a medium between the active layer and the reflective layer, m is an integer greater than or equal to 0, $\Delta$ is a value smaller than $3\lambda/16n$, and $\alpha$ may be a skin depth in the reflective layer.

17. A light emitting device package comprising:
a package body;
an electrode installed at the package body; and
the light emitting device of claim 1 connected electrically to the electrode.

* * * * *